United States Patent [19]

Scott

[11] Patent Number: 4,772,845
[45] Date of Patent: Sep. 20, 1988

[54] CABLE CONTINUITY TESTOR INCLUDING A SEQUENTIAL STATE MACHINE

[75] Inventor: Carl A. Scott, Goleta, Calif.

[73] Assignee: Raytheon Company, Lexington, Mass.

[21] Appl. No.: 3,672

[22] Filed: Jan. 15, 1987

[51] Int. Cl.$^4$ .................................... G01R 31/02
[52] U.S. Cl. ........................................ 324/66; 324/540
[58] Field of Search .............. 324/539, 540, 66, 73; 371/24, 25

[56] References Cited

U.S. PATENT DOCUMENTS

| | | | |
|---|---|---|---|
| 3,673,397 | 6/1972 | Schaefer | 371/25 |
| 3,699,438 | 10/1972 | Webb | 324/66 |
| 3,944,975 | 3/1976 | Yasumoto | 371/24 |
| 3,986,106 | 10/1976 | Shuck | 324/66 |
| 4,055,801 | 10/1977 | Pike | 371/25 |
| 4,277,740 | 7/1981 | Parks | 324/66 |
| 4,282,479 | 8/1981 | Deboo | 324/539 |
| 4,290,137 | 9/1981 | Hilker | 371/24 |
| 4,536,703 | 8/1985 | Jablway | 324/66 |
| 4,601,033 | 7/1986 | Whelan | 371/25 |
| 4,654,850 | 3/1987 | Rodrigues | 371/25 |

FOREIGN PATENT DOCUMENTS 0114864 7/1982 Japan .................................... 324/66

OTHER PUBLICATIONS

Formica: "Cable Tester"-Technical Bulletin May 1974.

Primary Examiner—Reinhard J. Eisenzopf
Assistant Examiner—Jose M. Solis
Attorney, Agent, or Firm—Richard M. Sharkansky

[57] ABSTRACT

Apparatus for testing a multiconductor cable is disclosed. The disclosed cable testor comprises a counter, the output of which is applied as a test signal to a portion of the conductors in the cable under test. A test signal for the remaining portion of the conductors in the cable under test is derived by inverting the output of the counter. Cable faults are detected by comparing the signals out of the cable to the applied test signals. The apparatus is controlled by a state machine which causes test signals to be successively generated until a cable fault is detected or a full set of test signals has been generated.

15 Claims, 2 Drawing Sheets

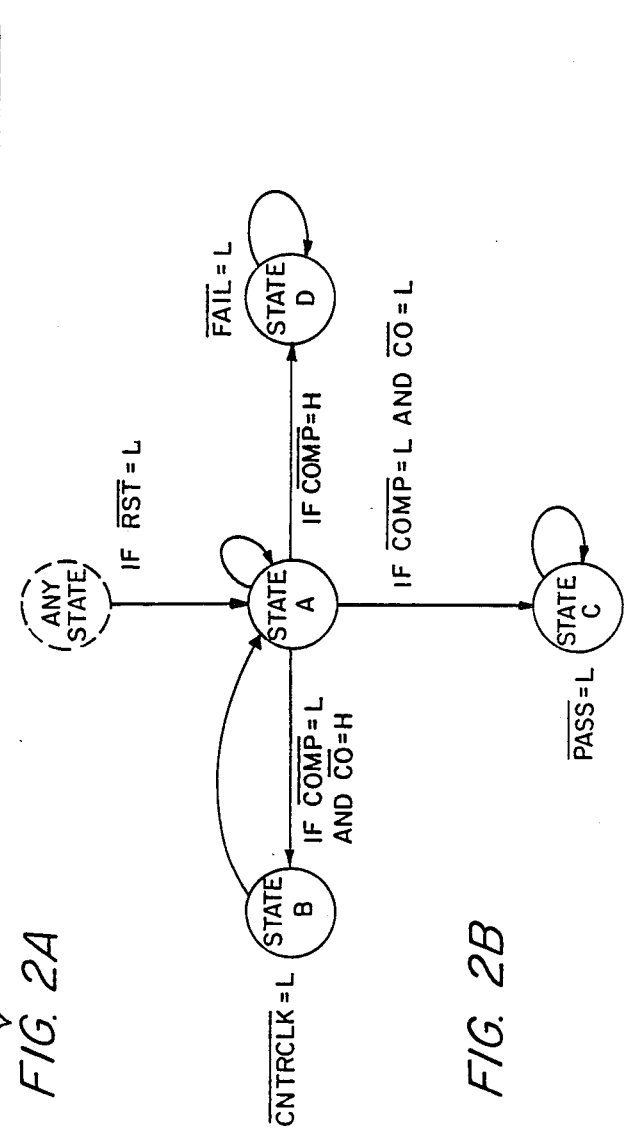

CABLE CONTINUITY TESTOR INCLUDING A SEQUENTIAL STATE MACHINE

BACKGROUND OF THE INVENTION

The present invention relates to cable continuity testors and more particularly to apparatus for testing continuity and logic faults of multiconductor cables.

As is known in the art, electronic systems such as computer systems typically comprise a number of printed circuit boards electrically interconnected through a "backplane" wiring assembly and cable harness wiring, each of which typically contain a great number of individual wires. To ensure proper operation of the system, the individual wires of the backplane and each cable of the cabling harness are typically tested for continuity after such backplane wiring and cables have been installed in the electronic system, thereby requiring a portable continuity testor.

One method of testing the continuity of the backplane wiring and cables, of course, is to manually test the continuity of each individual wire, for example, with an ohmmeter. However, such manual testing is quite time consuming, labor intensive and error prone. Conventional portable cable testing devices are capable of testing continuity of multiconductor cables either one wire at a time, or in a "daisy-chain" fashion. Another conventional multiconductor cable testor is connected in parallel with the cable under test and checks all of the cable conductors at once by applying a single reference voltage level to the cable conductors at a first end of the cable and comparing the outputs of the cable conductors at the second end of the cable to such reference voltage (i.e., a "static test"). Still another commercially available cable testor is connected in series between the cable under test and the electrical devices to which the cable is coupled during operation. The testor monitors whether signal activity is present on each of the conductors of the cable. While the above described cable continuity testors are portable and thus may be used to test backplanes and cables previously installed in an electronic system, and are thus satisfactory in some applications, they may not be suitable for use in applications requiring testing for binary combinations of signals which will be applied to the cable during operation.

That is, in some applications, especially for backplanes and multiconductor cables used in digital computer systems, it is desirable to test the multiconductor cable or backplane for a multiplicity of logic faults, such as "stuck at zero" (SA0) wires, or "stuck at one" (SA1) conductors, open (i.e., broken or missing) wires, shorted wires, crossed wires, or combinations of such faults. One conventional cable testor capable of testing for the above-identified faults utilizes a microprocessor and memory programmed to control the testing of the backplane or cable, with the apparatus being programmed to perform the various required tests. For example, different logical combinations of signals are applied to the cable under test and compared with the output produced by the cable to determine if any of the above-identified fault conditions exist. While such a microprocessor-based testing apparatus is satisfactory in some applications, it is noted that the apparatus typically is not portable or suitable for use in "field testing" due to the relatively large size thereof and the fact that the apparatus typically must be programmed by trained personnel using specific test programming languages. Also, such a microprocessor-based cable testor is relatively slow, since the apparatus follows a software program for each set of test data applied to the cable, making several decisions based on the resultant output signals from the cable. This can be disadvantageous in applications where the cable or backplane comprises a great number of individual conductors, often requiring several minutes to test a single cable. Moreover, such microprocessor-based cable testors are relatively expensive and require a good deal of support circuitry (e.g., memories, timing circuitry, etc.), and thus utilize a relatively large amount of power.

SUMMARY OF THE INVENTION

In accordance with the present invention, apparatus is provided for testing a multiconductor cable, such apparatus comprising: means for successively producing a predetermined number of test signals, each one of the predetermined number of test signals being produced in response to an applied clock signal, and applying each one of the predetermined number of test signals to a first end of the multiconductor cable; and means for comparing each one of the predetermined number of test signals applied to the first end of the multiconductor cable with a corresponding signal produced at a second end of the multiconductor cable in response thereto. Also provided is a state machine, responsive to a first control signal from the comparing means and a second control signal from the test signals producing means. The state machine proceeds from a first state to a second state when: one of the predetermined number of test signals applied to the first end of the multiconductor cable compares equally with the corresponding signal produced at the second end of the multiconductor cable in response thereto; and, the test signals producing means has produced less than the predetermined number of test signals. The state machine applies the clock signal to the test signals producing means in the second state and proceeds back to the first state. The state machine proceeds from the first state to a third state when: one of the predetermined number of test signals applied to the first end of the multiconductor cable compares equally with the corresponding signal produced at the second end of the multiconductor cable in response thereto; and, the test signals producing means has produced the predetermined number of test signals. The state machine produces a first output signal in the third state, such first output signal indicating that the multiconductor cable has passed the test. Alternately, the state machine proceeds from the first state to a fourth state when one of the predetermined number of test signals applied to the first end of the multiconductor cable compares unequally with the corresponding signal produced at the second end of the multiconductor cable in response thereto. The state machine produces a second output signal in the fourth state, such second output signal indicating that the multiconductor cable has failed the test.

With such arrangement, a multiconductor cable testor is provided having a testing operation controlled by a sequential state machine, such as a field programmable logic sequencer, which proceeds between relatively few allowed operating states. Thus, the testor performs a complete test on a multiwire cable in substantially less time than that required by a conventional microprocessor-based system, which follows a set of software instructions for each test signal applied to the cable, making several decisions for each such applied test signal.

Thus, the present invention allows complete testing of a multiwire cable for such faults as wires "stuck-at-one" (SA1) or "stuck-at-zero" (SA0), open (broken or missing) wires, shorted wires, crossed conductors, or combinations of such faults, in substantially less time than with conventional multiwire cable testors. Further, the state machine requires little support circuitry, thereby reducing the power consumption and size of the apparatus and thus providing a portable multiconductor cable testing apparatus.

BRIEF DESCRIPTION OF THE DRAWINGS

The foregoing features of the present invention and the advantages thereof may be fully understood from the following detailed description read in conjunction with the accompanying drawings wherein:

FIG. 2A is a state table for a sequential state machine included in the cable continuity testor of FIG. 1; and FIG. 2B is a state diagram for the sequential state machine state table of FIG. 2A.

DESCRIPTION OF THE PREFERRED EMBODIMENT

Figure 1:
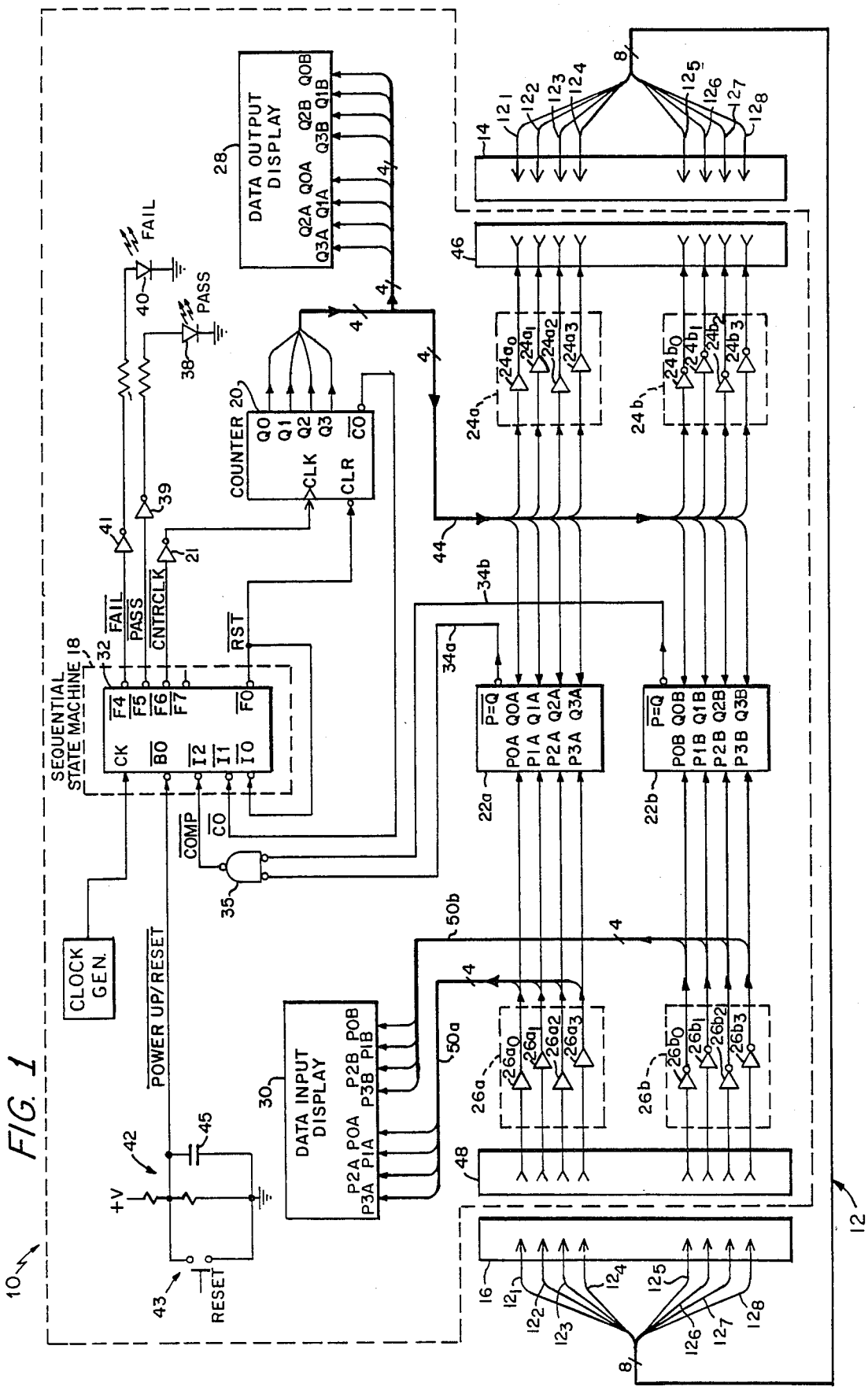
FIG. 1 is a block diagram of a cable continuity testor according to the present invention.

Referring now to FIG. 1, shown is a block diagram of the cable continuity testor 10 of the present invention coupled to a cable under test (CUT) 12, here a multiconductor cable, here comprising eight individual conductors or wires $12_1$–$12_8$ coupled between a pair of conventional multiconductor connectors disposed at first and second ends 14, 16, respectively, of CUT 12, as shown. Cable continuity tester 10 comprises sequential state machine 18, counter 20, comparators 22a, 22b output buffer circuits 24a (comprising noninverting buffers $24a_0$–$24a_3$), 24b (comprising inverting buffers $24b_0$–$24b_3$), input buffer circuits 26a (comprising noninverting buffers $26a_0$–$26a_3$), 26b (comprising inverting buffers $26b_0$–$26b_3$), data output display 28 and data input display 30, interconnected as shown in FIG. 1. The specific interconnection between such devices, the details of sequential state machine 18 and the operation of testor 10 are fully discussed hereinafter. Suffice it here to say that counter 20 successively produces a predetermined number of test signals on bus 44, each test signal here being a digital word comprising a plurality (here four) of bits produced in response to an applied clock signal ($\overline{\text{CNTRCLK}}$) from sequential state machine 18. Each test signal is applied to the first end 14 of CUT 12. Comparators 22a, 22b compare each test signal applied to the first end 14 of CUT 12 with a corresponding signal produced at the second end 16 of CUT 12 in response to such test signal. Sequential state machine 18 responds to control signals from comparators 22a, 22b and counter 20 to control the test of cable 12. The state machine 18 proceeds from a first state to a second state when: a test signal applied to the first end 14 of CUT 12 compares equally with a corresponding signal produced at CUT second end 16 in response thereto; and, counter 20 has produced less than the predetermined number of test signals. In the second state, state machine 18 produces a clock pulse ($\overline{\text{CNTRCLK}}$) for counter 20 and proceeds back to the first state. Such operation continues for successive data signals produced by counter 20 (in response to successive $\overline{\text{CNTRCLK}}$ signals) that are equally compared with corresponding successive signals produced at CUT second end 16 until counter 20 has produced the predetermined number of test signals (here, as evidenced by overflow control signal $\overline{\text{CO}}$). At such point, state machine 18 proceeds from the first state to a third state and produces a first output signal, illuminating the "PASS" LED 38 to indicate that CUT 12 has passed the test. Alternately, if a test signal applied to CUT first end 14 compares unequally with the corresponding signal produced at CUT 12 second end 16 in response thereto, state machine 18 proceeds from the first state to a fourth state, producing a second output signal to illuminate "FAIL" LED 40 and indicate that cable 12 has failed the test. With such arrangement a multiconductor cable testor is provided for testing a cable for continuity and for such logic faults as "stuck at zero" (SA0) wires, "stuck at one" (SA1) conductors, open (e.g., broken or missing) wires, shorted wires, crossed conductors or combinations of such faults. Thus, a portable and inexpensive multiconductor cable testor 10 is provided which rapidly performs a complete continuity and logic fault test on cable under test 12. Since testor 10 is based on the operation of sequential state machine 18, which does not follow a software testing program, testor 10 performs a complete test of cable 12 much faster than is possible with a larger, microprocessor-based testor. Also, since sequential state machine 18 does not require a large amount of support circuitry, testor 10 is relatively inexpensive, is portable, and requires much less operating power than conventional microprocessor-based cable testors.

Here, sequential state machine 18 comprises a commercially available FPLS 32, here a model 82S159, manufactured by Signetics Corporation, Sunnyvale, Calif., the details of which are discussed hereinafter. Clock generator 36, here a conventional pulse train generator, couples a binary clock signal of predetermined frequency, here 4 MHz, to the clock input (CK) of FPLS 32. Here, the inputs of FPLS 32 are applied to pins $\overline{\text{I0}}$, $\overline{\text{I1}}$, $\overline{\text{I2}}$ and $\overline{\text{B0}}$ thereof, and FPLS 32 produces output signals in accordance with such input signals, and the programming of FPLS 32, at pins $\overline{\text{F0}}$, $\overline{\text{F4}}$, $\overline{\text{F5}}$ and $\overline{\text{F6}}$. Outputs F0 and F6 are applied to the clear ($\overline{\text{CLR}}$) and clock (CLK) inputs, respectively, of counter 20, here a conventional, synchronous 4-bit counter, although a larger counter, or an array of counters, may be substituted therefor, for cables under test comprising a greater number of individual conductors than that illustrated for cable 12, as will be discussed. It should be noted that cable 12 is shown here as comprising only eight conductors ($12_1$–$12_8$) for ease of explanation of the invention, and the present invention may be applied to test multiconductor cables comprising more, or less, individual wires. FPLS 32 output $\overline{\text{F0}}$ is also fed back to input $\overline{\text{I0}}$ thereof, for purposes to be discussed. Output $\overline{\text{F5}}$ is coupled to a test "PASS" indicator 38, here a green LED, through a current limiting resistor, as shown. Likewise, output $\overline{\text{F4}}$ is coupled to a test "FAIL" indicator 40, here a red LED, through a current limiting resistor. FPLS 32 pin $\overline{\text{B0}}$ may be utilized as either an input pin or an output pin, but here FPLS 32 is programmed (as will be discussed) with pin $\overline{\text{B0}}$ as an input pin to receive a control signal from power-up/reset circuit 42, as discussed hereinafter.

The count outputs Q0–Q3 of counter 20 are coupled on bus 44 to: a first set of inputs of comparator 22a (Q0A–Q3A, respectively); a first set of inputs of comparator 22b (Q0B–Q3B, respectively); the inputs of noninverting buffers $24a_0$–$24a_3$, respectively, and inverting buffers $24b_0$–$24b_3$, respectively; and first and second sets of inputs of data output display 28 (Q0A–Q3A, respectively, and Q0B–Q3B, respectively). For example, counter output Q0 is coupled on bus 44 to comparatopr 22a input Q0A, comparator 22b input Q0B, buffers $24a_0$, $24b_0$ and display 28 inputs Q0A, Q0B. Counter output Q1 is applied via bus 44 to comparator inputs Q1A, Q1B, buffers $24a_1$, $24b_1$ and display inputs Q1A, Q1B. Likewise, counter output Q2 is fed to comparator inputs Q2A, Q2B, buffers $24a_2$, $24b_2$ and display inputs Q2A, Q2B via bus 44. Counter output Q3 is coupled on bus 44 to comparator inputs Q3A, Q3B, buffers $24a_3$, $24b_3$ and display inputs Q3A, Q3B. The overflow output, $\overline{CO}$, of counter 20 is coupled to input $\overline{I_1}$ of FPLS 32, as shown.

The outputs of noninverting output buffers $24a_0$–$24a_3$ and inverting output buffers $24b_0$–$24b_3$ are here coupled to corresponding individual sockets (not numbered) on multiwire connector receptacle 46, which constitute the output ports of testor 10. Receptacle 46 is adapted to receive a conventional plug disposed at a first end 14 of cable under test 12 and couple the outputs of buffers 24a, 24b to corresponding individual conductors $12_1$–$12_8$, respectively, of such cable 12. Thus, the outputs of noninverting buffers $24a_0$–$24a_3$ are coupled to conductors $12_1$–$12_4$, respectively, and conductors $12_5$–$12_8$ are fed by the outputs of inverting buffers $24b_0$–$24b_3$, respectively. A second connector 48, here a conventional multi-socket receptacle, the sockets of which constitute the input ports of testor 10, is adapted to receive the plug disposed at second end 16 of cable under test 12 and to couple individual conductors $12_1$–$12_8$ to the inputs of corresponding input buffers 26a, 26b. Thus, as shown, conductors $12_1$–$12_4$ are coupled to the inputs of noninverting buffers $26a_0$–$26a_3$, respectively, and conductors $12_5$–$12_8$ are applied to the inputs of inverting buffers $26b_0$–$26b_3$, respectively. The inputs of buffers $26a_0$–$26a_3$, $26b_0$–$26b_3$ are here coupled to $+V$ through suitable pull-up resistors (not shown).

The outputs of noninverting input buffers $26a_0$–$26a_3$ are coupled on bus 50a to a second set of inputs of comparator 22a (inputs P0A–P3A, respectively) and a first set of inputs of data input display 30 (inputs P0A–P3A, respectively). Thus, the output of buffer $26a_0$ is coupled on bus 50a to comparator input P0A and data display input P0A. Likewise, bus 50a couples buffer $26a_1$, to comparator input P1A and display input P1A. Also, buffer $26a_2$ is coupled to comparator input P2A and data display input P2A by bus 50a, with such bus 50a likewise coupling buffer $26a_3$ to comparator input P3A and display input P3A. The outputs of inverting input buffers $26b_0$–$26b_3$ are correspondingly coupled in a similar fashion on bus 50b to corresponding ones of a second set of inputs, P0B–P3B, of comparator 22b and corresponding ones of a second set of inputs, P0B–P3B, of data input display 30. Comparators 22a, 22b produce active low output signals $\overline{(P=Q)}$ on lines 34a, 34b, respectively, each such output signal $\overline{P=Q}$ having a logic low (L) voltage level when the binary signals applied to the "Q" and "P" inputs of comparators 22a, 2b are equal, and having a logic high (H) level when such binary signals applied to the "Q" and "P" inputs are unequal. The output signals $\overline{P=Q}$ are applied to the $\overline{I2}$ input of FPLS 32 through conventional OR circuit 35, as shown.

Thus, it is seen that for each count of counter 20, the count output Q0–Q3 is applied as a test signal to cable 12, comparators 22a, 22b, and data output display 28, here as a pair of data words, here such pair of data words being identical 4-bit words. A first one of the pair of data words is applied to: the first set of inputs Q0A–Q3A of comparator 22a; the first set of inputs Q0A–Q3A of display 28; and, noninverted by buffers $24a_0$–$24a_3$, to a first portion of the conductors of cable 12, here conductors $12_1$–$12_4$. The noninverted first one of the pair of data words is coupled by cable conductors $12_1$–$12_4$ to the second set of inputs P0A–P3A of comparator 22a and the first set of inputs P0A–P3A of data input display 30, via noninverting buffers $26a_0$–$26a_3$. The second one of the pair of data words is applied to: the first set of inputs Q0B–Q3B of comparator 22b; the second set of inputs Q0B–Q3B of data output display 28; and, inverted by buffers $24b_0$–$24b_3$, to a second portion of the conductors of cable 12 (here, conductors $12_5$–$12_8$). The inverted second one of the pair of data words is coupled by cable conductors $12_5$–$12_8$, reinverted by buffers $26b_0$–$26b_3$, and applied to the second set of inputs P0B–P3B of comparator 22b and the second set of inputs P0B–P3B of data input display 30. Here, displays 28, 30 are each two digit hexidecimal displays, with the first digit of each display (i.e., inputs Q0A–Q3A of display 28 and inputs P0A–P3A of display 30) corresponding to the first one of the pair of data words, and the second digit of each hexidecimal display 28, 30 (i.e., inputs Q0B–Q3B of display 28 and inputs P0B–P3B of display 30) being produced in response to the second one of the pair of data words. Thus, displays 28, 30 each display a representation, here an alphanumerical representation, of the signals applied thereto.

The FPLS 32 of sequential state machine 18, here a commercially available 82S159 manufactured by Signetics, comprises an array of AND gates, an array of OR gates and a plurality of flip-flops which, as is known, are selectively interconnected by the user to provide the desired sequential state machine function in accordance with the input signals applied thereto. As is also known, a sequential state machine is stepped from a first state (called the "present state" of the machine) to a second state (known as the "next state" of the machine) upon receipt of a clock signal (here from clock generator 36) if, and only if, a predetermined set of input conditions (here determined by the levels of the signals applied to input pins $\overline{I0}, \overline{I1}, \overline{I2}, \overline{B0}$) are met. Here, FPLS 32 is programmed (by selectively interconnecting the AND gates, OR gates and flip-flops provided therein) to function in accordance with the state table shown in FIG. 2A and follow the state diagram of FIG. 2B. From the state diagram of FIG. 2B, it is first noted that here sequential state machine 18 has only four allowed states: states A–D. Referring to FIG. 2A, in state A, output $\overline{F7}$ of FPLS 32 (FIG. 1) is "active" (i.e., is a logic "low" (L) voltage); in state B, FPLS output $\overline{F6}$ is low; FPLS output $\overline{F5}$ is low in state C; and in state D, FPLS output $\overline{F4}$ is a logic low voltage. Referring to FIG. 1 and taking the state table of FIG. 2A row-by-row, it is seen that here FPLS 32 is programmed to produce an "active" or logic "low" signal, $\overline{RST}$, at output $\overline{F0}$ on the rising edge of the first clock pulse (CK) after input $\overline{B0}$ goes low, regardless of the state of sequential state machine 18 at such time (i.e., in any "present state" of the machine). Observation of FIG. 1 reveals that FPLS 32 input $\overline{B0}$ is forced low either: when reset button 43 of power-up/reset circuit 42 is depressed; or momentarily when cable continuity testor 10 is powered up with the application of a reference voltage $+V$ (here $+5$ volts) to such circuit 42. Input $\overline{B0}$ becomes a logic high voltage a short time after reset button 43 is released or after reference voltage $+V$ is applied, due to the charging of capacitor 45 in circuit 42.

As shown in FIG. 1, $\overline{RST}$ is applied to clear counter 20, for purposes to be discussed, and also to the $\overline{I0}$ input of FPLS 32. Referring to the second row of the FIG. 2A state table, it is seen that FPLS 32 is further programmed to step from any present state to state A on the rising edge of the first clock pulse (CK) after such input $\overline{I0}$ becomes low. In state A, output F7 of FPLS 32 is active (i.e., a logic low voltage) while outputs $\overline{F6}$, $\overline{F5}$, $\overline{F4}$ are all inactive (i.e., logic high voltages). Proceeding, FPLS 32 is further programmed to step from state A to state B if inputs $\overline{B0}$, $\overline{I0}$ and $\overline{I1}$ are high and input $\overline{I2}$ is low. Such input condition occurs during operation when testor 10 is not being reset or powered-up, the compare outputs (P=Q) of comparators 22a, 22b are both low (with OR gate 35 producing a logic low $\overline{COMP}$ signal in response to the low P=Q signals from comparators 22a, 22b), and the overflow output ($\overline{CO}$) of counter 20 is high. As discussed in detail hereinafter, this condition occurs when a data word produced by counter 20 and applied to CUT 12 first end 14 is equal to the data received by testor 10 at CUT 12 second end 16, but testing of cable 12 is not yet complete. In state B, FPLS 32 produces an active (i.e., logic low) signal, $\overline{CNTRCLK}$, at output $\overline{F6}$ thereof, while producing inactive (i.e., logic high) signals at outputs $\overline{F7}$, $\overline{F5}$ and $\overline{F4}$. A low $\overline{CNTRCLK}$ signal generates (via inverter 21) a rising edge clock pulse for counter 20, thereby incrementing the outputs thereof (Q0–Q3) by one count, as is known.

As shown in the state table of FIG. 2A, FPLS 32 will step from state B back to state A upon the rising edge of the next clock pulse (CK) so long as testor 10 is not being reset or powered-up (i.e., $\overline{I0}$, $\overline{B0}$ are both high), regardless of the levels of iputs $\overline{I1}$, $\overline{I2}$, for purposes to be discussed. When the present state of the machine is state A, FPLS 32 will step on the next clock pulse (CK) to state C when, and only when: testor 10 is not being reset or powered-up; and, the compare outputs (P=Q) of comparators 22a, 22b are both low producing a low $\overline{COMP}$ signal, and the overflow output ($\overline{CO}$) of counter 20 is also low. As discussed in detail below, this condition occurs only when the data applied to CUT 12 equals the data received from CUT 12 (i.e., all of the corresponding "Q" and "P" inputs of comparators 22a, 22b are equal) and counter 20 has applied all of the test data words to cable 12—meaning that the test is complete. In state C, FPLS 32 produces an active low $\overline{PASS}$ signal at output $\overline{F5}$ thereof while maintaining outputs $\overline{F7}$, $\overline{F6}$ and $\overline{F4}$ inactive (i.e., as logic high signals). As shown in FIG. 1, the logic low $\overline{PASS}$ signal is inverted by inverter 39 and illuminates "PASS" LED 38.

Alternately, when the present state of the machine is state A, FPLS 32 will be stepped to state D upon the next clock pulse (CK) when, and only when: testor 10 is not being reset or powered-up; and, input $\overline{I2}$ is high, regardless of the level of input $\overline{I1}$. As shown in FIG. 1, FPLS input I2 is high whenever the compare output (P=Q) of either one of comparators 22a, 22b is high (with OR gate 35 respondingly generating a logic high $\overline{COMP}$ signal), which occurs when data word applied to the "Q" inputs of comparator 22a or 22b does not equal the tests data word applied to the "P" inputs thereof, that is, when data applied to the first end of CUT 12 is unequal to data received from the second end of CUT 12. In state D, FPLS 32 generates an active (i.e., logic low) $\overline{FAIL}$ signal at output $\overline{F4}$ thereof, while producing inactive (i.e., high) signals at outputs $\overline{F7}$, $\overline{F6}$ and $\overline{F5}$. The active $\overline{FAIL}$ signal is inverted by invertor 41 to illuminate the "FAIL" LED 40 (FIG. 1) to thereby indicate that cable under test 12 has failed the continuity test.

The state diagram for sequential state machine 18 with FPLS 32 programmed as discussed above is shown in FIG. 2B. It is noted, as shown in the state table of FIG. 2A, that the occurrence of a clock (CK) from clock generator 36 is required for sequential state machine FPLS 32 to step from a "present state" to a "next state". Thus, it is understood that in FIG. 2B the machine steps from a present state to a next state upon the occurrence of the next clock pulse CK after the required input signal conditions for a change of machine state are satisfied. Thus, FPLS 32 steps from any state to state A upon the occurrence of the next clock pulse CK after signal $\overline{RST}$ becomes active (i.e., becomes a logic "low" voltage). Sequential state machine FPLS 32 proceeds from state A to state B on the next clock pulse after signal $\overline{COMP}$ from comparators 22a, 22b (via OR gate 35) becomes low with $\overline{CO}$ from counter 20 being high. In state B, FPLS 32 produces an active $\overline{CNTRCLK}$ signal to increment counter 20, and then FPLS 32 proceeds back to state A upon the next occurrence of clock pulse CK from clock generator 36. It is noted here that, for purposes to be discussed, FPLA 32 is programmed to step only to state A from state B (i.e., the sequential state machine cannot go to states C or D directly from state B), and FPLA 32 must return to state A on the next clock pulse after FPLA 32 goes to state B. When FPLA 32 is in state A, FPLA 32 steps to state C and produces an active $\overline{PASS}$ signal upon the occurrence of a clock pulse CK only when signals $\overline{COMP}$ and $\overline{CO}$ both become low. FPLA 32 remains in state C for successive clock pulses CK until testor 10 is reset by power-up/reset circuit 42, as signified by the arrow looping from state C back to state C in FIG. 2B. Alternately, when sequential state machine FPLA 32 is in state A, FPLA 32 steps to state D (upon the next clock pulse CK) if, and only if, the $\overline{COMP}$ signal from comparators 22a, 22b (via OR gate 35) goes high. In state D, FPLA 32 produces an active $\overline{FAIL}$ signal, and FPLA 32 remains in state D for successive clock pulses CK until FPLA 32 is reset by power-up/reset circuit 42, as shown by the looped arrow at state D in FIG. 2B. It is noted, with regard to state A, that FPLA 32 remains in state A for successive clock pulses CK until one of the input signal conditions described above for stepping to states B, C or D is satisfied, as signified by the looped arrow at state A.

Referring again to FIG. 1, the operation of cable continuity tester 10 with sequential state machine FPLS 32 programmed as discussed above and in accordance with FIGS. 2A, 2B will now be discussed. Briefly, a complete test procedure is performed by successively applying the counts (i.e., outputs Q0–Q3) of counter 20 as test signals to CUT 12 and comparing, for each count of counter 20, the data applied to CUT 12 with the data received from CUT 12. If the compared sets of data are equal, FPLS 32 increments counter 20 by one count (by producing an active $\overline{CNTRCLK}$ signal) and such next count is applied to cable 12. Here, counter 20 produces 16 successive counts (i.e., from 0000 to 1111 at outputs Q0–Q3) which are successively applied as sets of test data to CUT 12 and compared with data received from CUT 12. If equal comparisons are made for all of such sets of test data, then FPLS 32 illuminates PASS LED 38, indicating that cable 12 has completed and passed the test procedure. However, if, for any count of counter 20, the test data received from cable 12 is unequal to that applied to cable 12, FPLS 32 halts the test procedure at the particular count of counter 20 for which the applied and received data is unequal, and illuminates FAIL LED 40 to indicate a test failure. Data output display 28 and data input display 30 indicate the data applied to and received from cable 12, thereby allowing an operator to isolate the one or ones of cable conductors $12_1$–$12_8$ responsible for the test failure simply by comparing the display 28, 30 readouts.

At the initiation of the continuity test procedure, the operator either powers-up testor 10 (by applying +V), or resets testor 10 (by depressing switch 43), thereby momentarily coupling an active (i.e., low voltage) $\overline{POW}$-$\overline{er\text{-}up/reset}$ signal to FPLS input $\overline{BO}$. As shown in FIGS. 2A, 2B, upon the occurrence of the next clock pulse (CK) produced by clock generator 36, FPLS 32 responds to such low signal at input $\overline{BO}$ by generating an active (i.e., low voltage) $\overline{RST}$ signal, thereby clearing counter 20 and setting the outputs Q3–Q0 thereof low (i.e., 0000). Thus, data output display 28, here a two-digit, hexidecimal display, displays "00", and data words 0000, 0000 are applied to inputs Q3A–Q0A, respectively, and Q3B–Q0B, respectively, of comparators 22a, 22b, respectively. At the same time, a data word 0000 is applied to CUT 12 conductors $12_4$–$12_1$, respectively, via non-inverting buffers $24a_3$–$24a_0$, respectively, and a data word having a value of 1111 is applied to CUT 12 conductors $12_8$–$12_5$, respectively, via inverting buffers $24b_3$–$24b_0$, respectively. Such 0000, 1111 data words propagate through cable 12 and are received by input buffer circuits 26a, 26b, respectively. Non-inverting buffers $26a_3$–$26a_0$ couple the data word received on CUT 12 conductors $12_4$–$12_1$, respectively, to the first digit inputs (P3A–P0A, respectively) of hexidecimal data input display 30 and to the inputs P3A–P0A, respectively, of comparator 22a. Inverting input buffers $26b_3$–$26b_0$ invert the logic level of the bits of the data word received on CUT 12 conductors $12_8$–$12_5$, respectively, and apply the reinverted data word to the inputs of the second digit of data input hexidecimal display 30 (i.e., inputs P3B–P0B, respectively) and to the inputs P3B–P0B, respectively, of comparator 22b.

It is noted that here clock generator 36 is a free-running pulse generator, here producing pulses at a frequency of 4 MHz. Thus, during the time that the data words propagate through CUT 12, clock generator 36 generates a second clock pulse. As shown in FIGS. 2A, 2B, FPLS 32 responds to an active (i.e., low) $\overline{RST}$ signal by stepping to state A in response to such second clock pulse. Also, before the data has propagated through CUT 12, the "Q" inputs (Q3A–Q0A) of comparator 22a most likely do not equal the "P" inputs (P3A–P0A) thereof. The same is also true regarding the "Q" and "P" inputs of comparator 22b. Thus, during such data propagation time, comparators 22a, 22b produce inactive (i.e., high logic voltage) output signals $\overline{P=Q}$ on lines 34a, 34b, respectively, and the resultant $\overline{COMP}$ signal produced by OR gate 35 is also a high logic voltage. The frequency of the clock pulses produced by clock generator 36 is selected to provide sufficient time for the data words applied to the "Q" inputs of comparators 22a, 22b, and to the first end of CUT 12, to propagate through CUT 12 to the "P" inputs of comparators 22a, 22b and be compared thereby with the corresponding "Q" inputs of comparators 22a, 22b before the occurrence of the next clock pulse (CK).

When such next clock pulse occurs, if the data words applied to iputs Q3A–Q0A of comparator 22a and inputs Q3B–Q0B of comparator 22b equal, bit-by-bit, the data words applied to inputs P3A–P0A, P3B–P0B, respectively, of such comparators, that is, if the data applied to the first end of CUT 12 equals the data received at the second end of CUT 12, then the $\overline{P=Q}$ outputs of the comparators 22a, 22b, respectively, will both be logic low (L) voltages, and the $\overline{COMP}$ signal produced by OR gate 35 will also be a logic low voltage. It is noted, however, that since the count of counter 20 is 0000, the overflow output $\overline{CO}$ thereof is inactive as a logic high (H) voltage. Thus, as shown in the state table of FIG. 2A and the state diagram of FIG. 2B, FPLS 32 responds to $\overline{COMP}=L$ and $\overline{CO}=H$ at such next clock pulse by proceeding to state B and producing a logic low (L) $\overline{CNTRCLK}$ signal, thereby incrementing counter 20 by one count (i.e., from Q3–Q0=0000 to 0001, respectively). On the next clock pulse from generator 36, FPLS 32 returns to state A.

The second data word (0001), and successive data words (i.e., 0010 through 1111), produced by counter 20 on bus 44 are coupled to the "Q" inputs of comparators 22a, 22b and to the "P" inputs of such comparators via CUT 12 in the same manner as that discussed in detail above for the first data word 0000. It is noted that the data applied to CUT 12 conductors $12_8$–$12_5$, respectively, is always inverted from that applied to conductors $12_4$–$12_1$, respectively, due to inverting output buffers $24b_3$–$24b_0$, respectively. Thus, it is seen that during the test procedure (i.e., as counter 20 counts up from 0000 to 1111), the data applied to conductors $12_4$–$12_1$ is counting up from 0000 to 1111, while the data applied to conductors $12_8$–$12_5$ is counting down from 1111 to 0000. Thus, corresponding wires of CUT 12, that is, conductors $12_1$, $12_5$; $12_2$, $12_6$; $12_3$, $12_7$; $12_4$, $12_8$, are always applied with data having opposite logic levels or states, thereby enabling the testor 10 to detect whether such corresponding wires are short-circuited together or crossed by generating data words having a length of only one-half of the number of conductors in CUT 12. That is, here, the use of inverting buffers $24b_3$–$24b_0$ allows full testing of eight-wire CUT 12 with test data words (generated by counter 20) of only 4-bits in length. To put it another way, here the ratio of the plurality of bits produced by counter 20 to the plurality of conductors of cable 12 is m=2n, with n representing the plurality of bits and m representing the plurality of conductors. Without inverting buffers $24b_3$–$24b_0$, counter 20 would have to be an 8-bit counter to apply the same range of test data to 8-wire CUT 12 as is applied in the present invention with 4-bit counter 20 and inverting buffers $24b_3$–$24b_0$ and noninverting buffers $24a_3$–$24a_0$. A little thought reveals that with such arrangement the total time required to fully test CUT 12 is reduced by a factor of two. It is noted that inverting input buffers $26b_3$–$26b_0$ re-invert the logic states of data received on CUT 12 conductors $12_8$–$12_5$, respectively, thereby permitting comparators 22a, 22b to accurately compare the data applied to the first end of CUT 12 to that received at the second end of cable 12.

The second data word (0001) and successive data words (i.e., 0010 through 1111) generated by counter 20 are successively compared by comparators 22a, 22b to produce successive input signals $\overline{COMP}$ (via OR gate 35) for FPLS 32 in the same manner as described above.

For each such generated data word, if the logic levels of all of the bits of the data applied to the first end of CUT 12 (and the "Q" inputs of comparators 22a, 22b) equal the logic levels of all of the bits of data coupled through CUT 12 to the "P" inputs of comparators 22a, 22b (i.e., if $\overline{\text{COMP}}=\text{L}$ for each such data word generated by counter 20), then, as shown in FIG. 2B, sequential state machine FPLS 32 loops between state A and state B. Each time FPLS 32 enters state B, the device produces a $\overline{\text{CNTRCLK}}=\text{L}$ signal to increment counter 20 and then FPLS 32 returns to state A. When the count of counter 20 reaches 1111, the overflow output $\overline{\text{CO}}$ thereof becomes active ($\overline{\text{CO}}=\text{L}$). If the data received from CUT 12 equals that applied to CUT for such data word 1111, comparators 22a, 22b and OR gate 35 apply an active $\overline{\text{COMP}}$ signal (i.e., $\overline{\text{COMP}}=\text{L}$) to FPLS 32. In response to $\overline{\text{COMP}}=\text{L}$ and $\overline{\text{CO}}=\text{L}$, FPLS 32 steps from state A to state C, as shown in FIGS. 2A, 2B, thereby producing an active $\overline{\text{PASS}}$ signal (i.e., $\overline{\text{PASS}}=\text{L}$), which illuminates the "PASS" LED 38, telling the operator that the test is complete and CUT 12 has passed. The operator may then reset testor 10 (e.g., by depressing reset switch 43), thereby returning FPLS 32 back to state A, and may proceed to test another cable.

If at any point during the test procedure described above, the data word generated by counter 20 and applied to the first end of CUT 12 is not equal to the data received from the second end of CUT 12, one (or both) of comparators 22a, 22b produces an inactive output signal (i.e., P=Q=H). The resultant $\overline{\text{COMP}}$ signal applied to FPLS 32 via OR gate 35 is thus also inactive ($\overline{\text{COMP}}=\text{H}$). FPLS 32 responds to such $\overline{\text{COMP}}=\text{H}$ signal on the next clock pulse CK by stepping from state A to state D and generating an active $\overline{\text{FAIL}}$ signal ($\overline{\text{FAIL}}=\text{L}$), as shown in FIGS. 2A, 2B, thereby illuminating "FAIL" LED 40, informing the operator that CUT 12 has failed the test. This automatically halts the test at the data word generated by counter 20 for which CUT 12 has failed, since FPLS 32 remains state D until the operator resets testor 10 and applies no further clock signals ($\overline{\text{CNTRCLK}}$) to counter 20. Thus, data output display 28 displays the generated data word for which CUT 12 failed the test, and data input display 30 displays the incorrect data received from CUT 12. By comparing the data displayed by displays 28, 30, the operator can identify the conductor, or conductors, of cable 12 which returned incorrect data to testor 10, thereby facilitating repair of CUT 12 and reducing repair time.

It is noted that in the test procedure discussed above, very few decisions are made by sequential state machine FPLS 32. Depending on the value of only three input variables ($\overline{\text{COMP}}$, $\overline{\text{CO}}$, $\overline{\text{RST}}$), FPLS 32 steps from state A to either state B, C or D. If FPLS 32 goes to state B, the machine immediately returns to state A (upon the next clock pulse CK applied thereto) after producing a $\overline{\text{CNTRCLK}}$ signal, and if the machine steps to either state C or state D, the test is over, due either to a complete test and a "good" cable (state C) or a test failure (state D). Thus, testor 10 performs a complete test on CUT 12 in substantially less time than that required by a test system, such as a microprocessor-based system, which follows a set of software instructions for each test data word applied to the cable-under-test, making several decisions for each such data test word in accordance with such programming instructions. It is further noted that during the test procedure discussed above, testor 10 applies every possible combination of logic signals, from all logic 0's to all logic 1's, to cable under test 12, thereby providing a complete continuity test of such cable for such faults as wires "stuck-at-one" (SA1) or "stuck-at-zero" (SA0), open (broken or missing) wires, shorted wires, crossed conductors, or combinations of such faults. As previously discussed, use of inverting buffers $24b_3$–$24b_0$, $26b_3$–$26b_0$ further reduces test time by permitting use of an n-bit counter to test a cable having 2n conductors.

Cable continuity testor 10 can be expanded to test cables having more than eight conductors by increasing the length of the data word produced by counter 20, for example, by serially coupling several counters in a known manner. The $\overline{\text{CO}}$ signal for FPLS 32 would be produced by the last one of the serially-coupled counters (i.e., the counter producing the most significant bit of the data word). Additionally, if the number of conductors of the cable under test is sufficiently large to require a large number of comparators, OR gate 35 could be implemented as a field programmable logic array (FPLA), such as an 82S153 FPLA manufactured by Signetics. The FPLA, which comprises an array of AND gates and an array of OR gates selectively interconnected by the user to provide a desired logic function, would be configured by the user to provide a multi-input OR logic function on the P=Q outputs of the several comparators to produce the $\overline{\text{COMP}}$ signal for FPLS 32. Testing of larger cables will also require expanding the length of displays 28, 30 to allow the operator to observe the full data words applied to the cable. Also, the total number of individual output buffers $24a_0$–$24a_3$, $24b_0$–$24b_3$ and input buffers $26a_0$–$26a_3$, $26b_0$–$26b_3$ will be increased to correspond to the number of conductors in the cable under test. It should be remembered, however, that utilizing inverting buffers for one-half of the CUT conductors permits a CUT having 2n number of conductors to be fully tested by generating data words having only n bits, as discussed above.

Having described a preferred embodiment of the present invention, modifications and alterations thereto may become apparent to those skilled in the art. Accordingly, it is intended that the scope of the present invention is to be limited only by the scope of the appended claims.

What is claimed is:

1. Apparatus for testing a multiconductor cable, comprising:
   (a) means for successively producing a predetermined number of test signals, each one of the predetermined number of test signals being produced in response to an applied clock signal, and applying each one of the predetermined number of test signals to a first end of the multiconductor cable;
   (b) means for comparing each one of the predetermined number of test signals applied to the first end of the multiconductor cable with a corresponding signal produced at a second end of the multiconductor cable in response thereto; and
   (c) state machine means, responsive to a first control signal from the comparing means and a second control signal from the test signals producing means, for:
      (i) proceeding from a first state to a second state when: one of the predetermined number of test signals applied to the first end of the multiconductor cable compares equally with the corresponding signal produced at the second end of the multiconductor cable in response thereto; and, the test signals producing means has produced less than the predetermined number of test signals, said state machine means producing the clock signal in the second state and proceeding back to the first state; and (ii) proceeding from the first state to a third state when: one of the predetermined number of test signals applied to the first end of the multiconductor cable compares equally with the corresponding signal produced at the second end of the multiconductor cable in response thereto; and, the test signals producing means has produced the predetermined number of test signals, said state machine means producing a first output signal in the third state; or (iii) proceeding from the first state to a fourth state when one of the predetermined number of test signals applied to the first end of the multiconductor cable compares unequally with the corresponding signal produced at the second end of the multiconductor cable in response thereto, said state machine means producing a second output signal in the fourth state.

2. The apparatus recited in claim 1 further comprising:

means for displaying a representation of each one of the predetermined number of test signals applied to the first end of the multiconductor cable; and means for displaying a representation of each signal produced at the second end of the multiconductor cable in response to each corresponding test signal applied to the first end thereof.

3. The apparatus recited in claim 1 wherein the state machine means comprises a programmable logic sequencer.

4. Apparatus for testing a cable comprising a plurality of conductors, such apparatus comprising:

(a) means for successively producing a predetermined number of digital test signals in response to corresponding successive clock signals, each one of the predetermined number of digital test signals comprising a plurality of bits;

(b) means for electrically coupling each one of the successively produced predetermined number of digital test signals to a first end of the cable, with each one of the plurality of bits of each digital test signal being electrically coupled to at least one of the plurality of conductors of the cable at the first end thereof;

(c) means for logically comparing the plurality of bits of each digital test signal coupled to the plurality of conductors at the first end of the cable with signals produced on corresponding ones of the plurality of conductors at a second end of the cable in response to each digital test signal coupled to the first end of the cable; and (d) state machine means, responsive to a first control signal from the digital test signals producing means and a second control signal from the comparing means for:

(i) proceeding from a first state to a second state when: the plurality of bits of one of the predetermined number of digital test signals coupled to the plurality of conductors at the first end of the cable logically compares equally with the signals produced on the corresponding ones of the plurality of conductors at the second end of the cable in response to said one of the predetermined number of digital test signals; and, the digital test signals producing means has produced less than the predetermined number of digital test signals, said state machine means coupling a clock signal to the digital test signals producing means in the second state and proceeding back to the first state; and (ii) proceeding from the first state to a third state when: the plurality of bits of one of the predetermined number of digital test signals coupled to the plurality of conductors at the first end of the cable logically compares equally with the signals produced on the corresponding ones of the plurality of conductors at the second end of the cable in response to said one of the predetermined number of digital test signals; and, the digital test signals producing means has produced the predetermined number of digital test signals, said state machine means generating a first output signal in the third state; or (iii) proceeding from the first state to a fourth state when the plurality of bits of one of the predetermined number of digital test signals coupled to the plurality of conductors at the first end of the cable logically compares unequally with the signals produced on the corresponding ones of the plurality of conductors at the second end of the cable in response to said one of the predetermined number of digital test signals, said state machine means generating a second output signal in the fourth state.

5. The apparatus recited in claim 4 wherein the electrical coupling means comprises:

means for electrically coupling a first portion of the plurality of bits of each digital test signal to a first portion of the plurality of conductors at the first end of the cable and non-inverting the logic level of each of the first portion of the plurality of bits; and means for electrically coupling a second portion of the plurality of bits of each digital test signal to a second portion of the plurality of conductors at the first end of the cable and inverting the logic levels of each one of the second portion of the plurality of bits.

6. The apparatus recited in claim 5 further comprising means for inverting the logic levels of the signals produced on the plurality of conductors at the second end of the cable corresponding to said second portion of the plurality of conductors at the first end of the cable.

7. The apparatus recited in claim 6 wherein the ratio of the plurality of bits to the plurality of conductors is $m = 2n$, where n represents the plurality of bits and m represents the plurality of conductors.

8. The apparatus recited in claim 4 wherein the comparing means comprises a plurality of comparators, a first one of the plurality of comparators being fed by a first portion of the plurality of bits of each digital test signal and a second one of the plurality of comparators being fed by a second portion of the plurality of bits of each digital test signal, the plurality of comparators producing a corresponding plurality of compare output signals.

9. The apparatus recited in claim 8 further comprising:

means for combining the plurality of compare output signals to produce the second control signal.

10. The apparatus recited in claim 9 wherein the combining means comprises a programmable logic array.

11. The apparatus recited in claim 4 further comprising:
   means for displaying a representation of each one of the predetermined number of digital test signals applied to the first end of the cable; and
   means for displaying a representation of each signal produced at the second end of the cable in response to each corresponding digital test signal applied to the first end thereof.

12. The apparatus recited in claim 4 wherein the state machine means comprises a programmable logic sequencer.

13. In combination:
   (a) counter means for successively producing a plurality of data words at a plurality of count output terminals in response to successive clock pulses;
   (b) means for coupling the plurality of count output terminals to a plurality of output ports and wherein said coupling means comprises means, electrically coupled to a portion of the plurality of output ports, for inverting a portion of each data word at the count output terminals;
   (c) a plurality of input ports, each one of the plurality of input ports connecting to one of the plurality of output ports;
   (d) means, having corresponding first and second sets of input terminals, each input terminal of the first set of input terminals being coupled to one of the plurality of output ports, and each input terminal of the second set of input terminals being coupled to a corresponding one of the plurality of input ports, for successively comparing each one of the plurality of data words coupled to the first set of input terminals thereof with corresponding successive data words coupled to the second set of input terminals thereof by a cable coupled between the plurality of output ports and the plurality of input ports; and
   (e) means, responsive to control signals from the comparing means and the counter means, for:
      (i) producing a clock pulse for the counter means when one of the plurality of data words coupled to the first set of input terminals of the comparing means compares equally with the corresponding one of the plurality of data words coupled to the second set of inputs thereof, and the counter means has produced less than a predetermined number of data words; and
      (ii) producing a first output signal when one of the plurality of data words coupled to the first set of input terminals of the comparing means compares equally with the corresponding one of the plurality of data words coupled to the second set of input terminals thereof, and the counter means has produced the predetermined number of data words; or
      (iii) producing a second output signal when one of the plurality of data words coupled to the first set of input terminals of the comparing means compares unequally with the corresponding one of the plurality of data words coupled to the second set of input terminals thereof.

14. The combination of claim 13 wherein the clock pulse and first and second output signals producing means comprises a programmable logic sequencer.

15. The combination of claim 14 further comprising:
   means for displaying a representation of each one of the plurality of data words coupled to the first set of input terminals of the comparing means; and
   means for displaying a representation of each one of the corresponding data words coupled to the second set of input terminals of the comparing means.

* * * * *